United States Patent
Seo et al.

(10) Patent No.: US 9,012,257 B2
(45) Date of Patent: Apr. 21, 2015

(54) VAPOR DEPOSITION APPARATUS AND METHOD, AND METHOD OF MANUFACTURING ORGANIC LIGHT EMITTING DISPLAY APPARATUS

(75) Inventors: Sang-Joon Seo, Yongin (KR); Seung-Hun Kim, Yongin (KR); Jin-Kwang Kim, Yongin (KR); Seung-Yong Song, Yongin (KR)

(73) Assignee: Samsung Display Co., Ltd., Yongin-si (KR)

( * ) Notice: Subject to any disclaimer, the term of this patent is extended or adjusted under 35 U.S.C. 154(b) by 573 days.

(21) Appl. No.: 13/356,301

(22) Filed: Jan. 23, 2012

(65) Prior Publication Data

US 2013/0017633 A1    Jan. 17, 2013

(30) Foreign Application Priority Data

Jul. 13, 2011    (KR) .................. 10-2011-0069487

(51) Int. Cl.
| | |
|---|---|
| *C23C 16/455* | (2006.01) |
| *C23C 16/458* | (2006.01) |
| *C23C 16/54* | (2006.01) |
| *H01L 51/56* | (2006.01) |
| *C23C 16/04* | (2006.01) |
| *H01L 51/00* | (2006.01) |

(52) U.S. Cl.
CPC ......... *C23C 16/042* (2013.01); *C23C 16/45563* (2013.01); *C23C 16/4587* (2013.01); *H01L 51/001* (2013.01); *C23C 16/45544* (2013.01)

(58) Field of Classification Search
None
See application file for complete search history.

(56) References Cited

U.S. PATENT DOCUMENTS

| | | | |
|---|---|---|---|
| 5,151,296 | A | 9/1992 | Tokunaga |
| 6,634,314 | B2 | 10/2003 | Hwang et al. |
| 6,820,570 | B2 | 11/2004 | Kilpela et al. |
| 7,674,497 | B2 | 3/2010 | Yamazaki et al. |
| 7,709,398 | B2 * | 5/2010 | Strauch et al. ............ 438/758 |
| 2006/0073276 | A1 | 4/2006 | Antonissen |
| 2006/0249077 | A1 * | 11/2006 | Kim et al. ............ 118/723 MP |
| 2007/0157879 | A1 | 7/2007 | Yotsuya |
| 2008/0241384 | A1 | 10/2008 | Jeong et al. |
| 2009/0194409 | A1 | 8/2009 | Utsunomiya et al. |

(Continued)

FOREIGN PATENT DOCUMENTS

| | | |
|---|---|---|
| JP | 07-094417 | 4/1995 |
| JP | 10-041286 | 2/1998 |

(Continued)

OTHER PUBLICATIONS

Varian 3290. Downloaded from URL<http://www.caeonline.com/listing/product/9006311/varian-3290> on Aug. 7, 2014.*

(Continued)

*Primary Examiner* — Joseph Schoenholtz
(74) *Attorney, Agent, or Firm* — Christie, Parker & Hale, LLP

(57) ABSTRACT

A vapor deposition apparatus, which is capable of performing a thin film deposition process and improving characteristics of a formed thin film, includes a chamber having an exhaust opening; a stage located in the chamber, and including a plurality of mounting surfaces on which the plurality of substrates may be mounted; and an injection unit having at least one injection opening for injecting a gas into the chamber in a direction parallel with surfaces of the plurality of substrates.

23 Claims, 6 Drawing Sheets

(56) References Cited

U.S. PATENT DOCUMENTS

| | | |
|---|---|---|
| 2010/0047450 A1 | 2/2010 | Li |
| 2010/0227060 A1 | 9/2010 | Na et al. |
| 2010/0323125 A1 | 12/2010 | Tachibana |
| 2011/0134018 A1* | 6/2011 | Seo et al. ............ 345/76 |
| 2011/0281029 A1 | 11/2011 | Honda et al. |

FOREIGN PATENT DOCUMENTS

| | | |
|---|---|---|
| KR | 10-2004-0063893 | 7/2004 |
| KR | 10-2004-0082177 A | 9/2004 |
| KR | 10-2008-0092787 A | 10/2008 |
| KR | 10-2009-0007795 | 1/2009 |
| KR | 10-2010-0012115 A | 2/2010 |
| KR | 10-0940579 B1 | 2/2010 |
| KR | 10-2010-0077444 A | 7/2010 |
| KR | 10-2010-0099917 | 9/2010 |
| KR | 10-2010-0106614 A | 10/2010 |
| KR | 10-1006583 B1 | 12/2010 |
| KR | 10-2011-0006234 A | 1/2011 |
| KR | 10-2011-0039198 | 4/2011 |

OTHER PUBLICATIONS

Aixtron OVPD mass production equipment, downloaded from URL< http://www.aixtron.com/fileadmin/documents/matrix/production_systems/OVPD_Mass_Production_Equipment.pdf> on Aug. 7, 2014.*

Definition of Reciprocal downloaded from URL< http://dictionary.reference.com/browse/reciprocal> on Aug. 8, 2014.*

U.S. Office action dated Sep. 12, 2013, for cross reference U.S. Appl. No. 13/352,191 (now U.S. Patent 8,828,490), (10 pages).

U.S. Office action dated Jan. 16, 2014, for cross reference U.S. Appl. No. 13/352,191 (now U.S. Patent 8,828,490), (11 pages).

KIPO Notice of Allowance dated Aug. 20, 2013, for Korean Patent application 10-2011-0069488, (2 pages).

Official Action dated Feb. 14, 2013, issued in Korean Patent Application No. 10-2011-0069487, 5 pages.

* cited by examiner

VAPOR DEPOSITION APPARATUS AND METHOD, AND METHOD OF MANUFACTURING ORGANIC LIGHT EMITTING DISPLAY APPARATUS

CROSS-REFERENCE TO RELATED PATENT APPLICATION

This application claims priority to and the benefit of Korean Patent Application No. 10-2011-0069487, filed on Jul. 13, 2011, in the Korean Intellectual Property Office, the disclosure of which is incorporated herein in its entirety by reference.

BACKGROUND

1. Field

The present invention relates to a vapor deposition apparatus, a vapor deposition method, and a method of manufacturing an organic light emitting display apparatus.

2. Description of Related Art

Semiconductor devices, display apparatuses, and other electronic devices include a plurality of thin films. The plurality of thin films may be formed using various methods, one of which is a vapor deposition method.

According to the vapor deposition method, one or more gases are used as a source for forming thin films. The vapor deposition method may include a chemical vapor deposition (CVD) method, an atomic layer deposition (ALD) method, and various other methods.

Among display apparatuses, organic light emitting display apparatuses are considered to be next generation display apparatuses due to their wide viewing angles, excellent contrast, and fast response speeds.

Organic light emitting display apparatuses include an intermediate layer having an organic emission layer between a first electrode and a second electrode that face each other, and one or more thin films. A deposition process may be used to form thin films of the organic light emitting display apparatus.

As the organic light emitting display apparatus increases in size and requires high resolution, it is difficult to form a large sized thin film having desired properties. In addition, there is a limitation in improving efficiency of processes for forming thin films.

SUMMARY

Exemplary embodiments of the present invention provide a vapor deposition apparatus capable of performing a deposition process efficiently and improving characteristics of thin films, a vapor deposition method, and a method of manufacturing an organic light emitting display apparatus.

According to an aspect of embodiments according to the present invention, there is provided a vapor deposition apparatus for forming a thin film on a plurality of substrates, the apparatus including: a chamber having an exhaust opening; a stage in the chamber, and including a plurality of mounting surfaces adapted for the plurality of substrates to be mounted thereon; and an injection unit having at least one injection opening for injecting a gas into the chamber in a direction parallel with surfaces of the plurality of substrates.

The plurality of mounting surfaces may be disposed in parallel with a direction in which gravity acts.

The injection unit may be disposed above the stage.

The plurality of mounting surfaces may include at least two mounting surfaces that are disposed in parallel with each other.

The exhaust opening may be coupled to a pump.

A source gas and a reaction gas may be sequentially injected through the injection opening.

The injection unit may have a plurality of injection openings through which a source gas and a reaction gas are independently injected.

The exhaust opening may be closer to the ground than the substrates are.

The apparatus may further include a mask having a mask opening for forming the thin film on the substrates in a desired pattern, wherein the mask is disposed on the substrates.

The apparatus may further include a driving unit configured to drive the stage so as to move the substrates while being mounted on the stage in the chamber.

The driving unit may convey the substrates in a direction perpendicular to surface directions of the substrates, on which the thin film is to be formed.

The driving unit may reciprocately convey the substrates in a direction perpendicular to surface directions of the substrates, on which the thin film is to be formed.

The injection unit may have a plurality of injection openings that are separated from each other along a direction in which the substrates are moved so as to perform the deposition process a plurality of times while moving the substrates.

The mounting surfaces may be respectively located at a side of the stage and an opposite side of the stage.

The mounting surfaces may be located at all sides of the stage.

According to another aspect of embodiments according to the present invention, there is provided a vapor deposition method for forming thin films on a plurality of substrates, the method including: mounting the plurality of substrates respectively on a plurality of mounting surfaces of a stage in a chamber; injecting a source gas into the chamber through an injection unit in a direction parallel with surfaces of the substrate, on which thin films are to be formed; performing exhaustion through an exhaust opening of the chamber; injecting a reaction gas into the chamber through the injection unit in a direction parallel with the surfaces of the substrates; and performing an exhaustion through the exhaust opening of the chamber.

The exhaustion may be performed by a pump.

The injection unit may have an injection opening, and the source gas and the reaction gas may be sequentially injected through the injection opening.

The injection unit may have a plurality of injection openings, and the source gas and the reaction gas may respectively be injected through different ones of the injection openings.

The mounting of the substrates may include placing a mask having an opening for forming the thin films of desired pattern on the substrates.

The thin film deposition may be performed while moving the substrates in a direction perpendicular to the surfaces of the substrate, on which the thin film is formed, while being mounted on the stage.

According to another aspect according to embodiments of the present invention, there is provided a method of manufacturing an organic light emitting display apparatus which includes a plurality of thin films including at least a first electrode, an intermediate layer including an organic emission layer, and a second electrode on a plurality of substrates. The method may include: mounting the plurality of substrates on a plurality of mounting surfaces of a stage in a chamber; injecting a source gas into the chamber through an injection unit in a direction parallel with surfaces of the substrate, on which the thin films are to be formed; performing exhaustion through an exhaust opening of the chamber; injecting a reaction gas into the chamber through the injection unit in a direction parallel with the surfaces of the substrates; and performing exhaustion through the exhaust opening of the chamber.

The forming of the thin films may include forming an encapsulation layer on the second electrode.

The forming of the thin films may include forming an insulating layer.

The forming of the thin films may include forming a conductive layer.

BRIEF DESCRIPTION OF THE DRAWINGS

The above and other features and aspects of the present invention will become more apparent by describing in detail exemplary embodiments thereof with reference to the attached drawings in which.

DETAILED DESCRIPTION

Hereinafter, embodiments of the present invention will be described as follows with reference to accompanying drawings.

Figure 1:
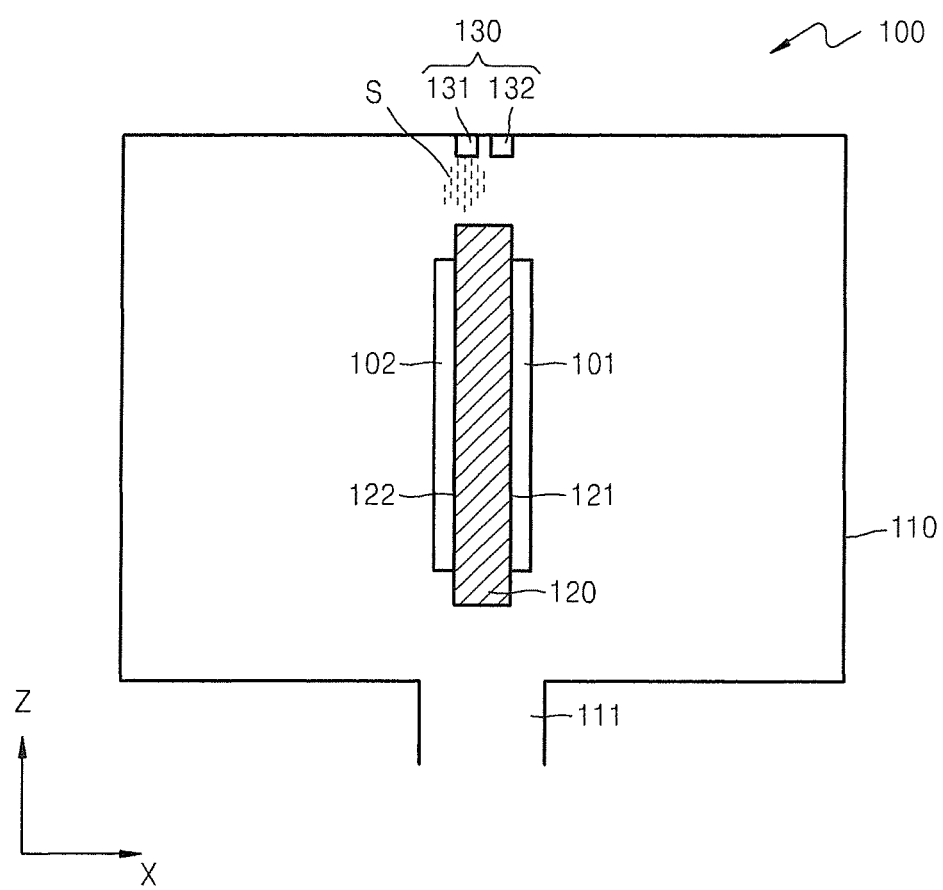
FIG. 1 is a schematic cross-sectional view of a vapor deposition apparatus according to an embodiment of the present invention.

FIG. 1 is a schematic cross-sectional view of a vapor deposition apparatus 100 according to an embodiment of the present invention.

Referring to FIG. 1, the vapor deposition apparatus 100 includes a chamber 110, a stage 120, and an injection unit 130.

The chamber 110 includes an exhaust opening (e.g., an exhaust hole) 111 on a lower portion thereof. The exhaust opening 111 is an outlet for exhausting gas, and may be coupled (or connected) to a pump so as to perform the exhaustion process sufficiently.

Although not shown in FIG. 1, the chamber 110 is controlled by a pump so as to maintain a suitable pressure (e.g., a predetermined pressure). In addition, a heating unit (not shown) for heating inside of the chamber 110 may be disposed on an inner or outer portion of the chamber 110 so as to improve efficiency of a thin film deposition process.

The stage 120 is disposed in the chamber 110. The stage 120 includes a first mounting surface 121 and a second mounting surface 122. The first and second mounting surfaces 121 and 122 are disposed in parallel with a direction in which gravity acts. That is, the first and second mounting surfaces 121 and 122 are disposed perpendicular to ground. To do this, the stage 120 is disposed perpendicularly to the ground.

First and second substrates 101 and 102 are disposed on the stage 120. In more detail, the first substrate 101 is mounted on the first mounting surface 121 of the stage 120, and the second substrate 102 is mounted on the second mounting surface 122 of the stage 120.

The first and second mounting surfaces 121 and 122 are in parallel with each other.

Fixing units (not shown) may be disposed on the first and second mounting surfaces 121 and 122 so that the substrates 101 and 102 may be fixed after being mounted on the first and second mounting surfaces 121 and 122. The fixing unit (not shown) may be a clamp, a compressing unit, an adhesive material, or other materials or devices known to those skilled in the art.

The injection unit 130 is disposed to be coupled (or connected) to the chamber 110. One or more gases are injected toward the substrates 101 and 102 through the injection unit 130. In more detail, the injection unit 130 includes a first injection opening (e.g., a first injection hole) 131 and a second injection opening (e.g., a second injection hole) 132, and the first and second injection openings 131 and 132 inject the gas in a direction parallel with surface directions of the substrates 101 and 102. That is, the gas is injected through the first and second injection openings 131 and 132 in parallel with a direction in which gravity acts.

In more detail, the first injection opening 131 is used to inject a source gas S, and a second injection opening 132 is used to inject a reaction gas. While the source gas S is being injected through the first injection opening 131, the reaction gas is not injected through the second injection opening 132, and the reaction gas is injected through the second injection opening 132 after injecting the source gas S through the first injection opening 131.

However, the present invention is not limited thereto. For example, the injection unit 130 may include only one injection opening. In other embodiments, the source gas S and the reaction gas may be sequentially injected through one injection opening.

In addition, a plurality of first injection openings 131 and a plurality of second injection openings 132 may be disposed so that the source gas S and the reaction gas may be injected onto (or near) the first and second substrates 101 and 102 separately.

The first and second injection openings 131 and 132 may be formed to have various shapes. For example, the first and second injection openings 131 and 132 may be formed as dots, spots, or lines corresponding to widths of the first and second substrates 101 and 102.

Operations of the vapor deposition apparatus 100 according to the present embodiment will now be described.

The first substrate 101 and the second substrate 102 are respectively mounted on the first mounting surface 121 and the second mounting surface 122 of the stage 120. After that, the source gas S is injected through the first injection opening 131 of the injection unit 130. In more detail, the source gas S may be a gas including aluminum (Al) atoms.

The source gas S is adsorbed on upper surfaces (e.g., surfaces opposite the surfaces facing the stage 120) of the first and second substrates 101 and 102. After that, exhaustion is performed by the exhaust opening 111, and then, an atom layer of a single-layered structure or a multi-layered structure formed of the source gas S is formed on the upper surfaces of the first and second substrates 101 and 102. That is, a single-layer or a multi-layer of Al atoms is formed.

In addition, the reaction gas is injected through the second injection opening 132 of the injection unit 130. As an example, the reaction gas may include oxygen (O) atoms. The reaction gas is adsorbed on the upper surfaces of the first and second substrates 101 and 102. After that, an exhaustion process is performed through the exhaust hole 111, and then, an atom layer of a single-layered structure or a multi-layered structure formed of the reaction gas is formed on the upper surfaces of the first and second substrates 101 and 102. That is, a single-layer or a multi-layer of oxygen atoms is formed.

Therefore, an atom layer having the single-layered structure or the multi-layered structure formed of the source gas S and the reaction gas is formed on the upper surfaces of the first and second substrates 101 and 102. That is, an aluminum oxide layer ($Al_xO_y$, where x and y may be controlled according to processing conditions) is formed. In the present embodiment, the aluminum oxide layer is formed; however, the present invention is not limited thereto. That is, embodiments of the present invention may be applied to processes for forming oxide layers, organic layers, inorganic layers, other insulating layers, and conductive layers.

According to the present embodiment, the gas is injected from the injection unit 130 in a direction parallel with the upper surfaces of the first and second substrates 101 and 102. In particular, the first and second substrates 101 and 102 are disposed in a direction perpendicular to the ground, that is, a direction in which gravity acts. Therefore, when the gas is injected through the injection unit 130 and adsorbed on the substrates 101 and 102, an unnecessarily adsorbed amount on the substrates 101 and 102 may be reduced. That is, unnecessary adsorbed components on the substrates 101 and 102 and other unevenly lumped components fall down due to gravity, and thus, the unnecessary amount is reduced. In addition, the unnecessary gas components may be easily removed by the exhaustion process through the exhaust opening 111 disposed on a lower portion of the first and second substrates 101 and 102. Therefore, after injecting the source gas S through the first injection opening 131 of the injection unit 130, the exhaustion process is performed without performing a purging process using an additional purge gas. After that, the reaction gas is injected through the second injection opening 132, the exhaustion process is performed without performing the purging process using an additional purge gas, and then, the deposition process is finished.

As a result, efficiency of the deposition process for forming desired thin films may be improved greatly. In addition, adsorption of unnecessary gas components may be prevented, and mixture of purge gas impurities into the thin films formed on the substrates 101 and 102 may be prevented. Therefore, the thin films may be evenly formed, and have excellent physical and chemical characteristics.

According to the present embodiment, the first and second mounting surfaces 121 and 122 are formed on both surfaces of the stage 120, and the first and second substrates 101 and 102 are formed on one stage 120 concurrently (e.g., simultaneously). Therefore, the processing efficiency may be further improved. In addition, the first and second substrates 101 and 102 are disposed on the stage 120 in parallel with each other, and thus, the surfaces on which the first and second substrates 101 and 102 are formed do not face each other, and the thin film deposition processes for forming thin films on the respective surfaces do not affect each other. Thus, uniform and excellent thin films may be formed on both substrates 101 and 102.

Figure 2:
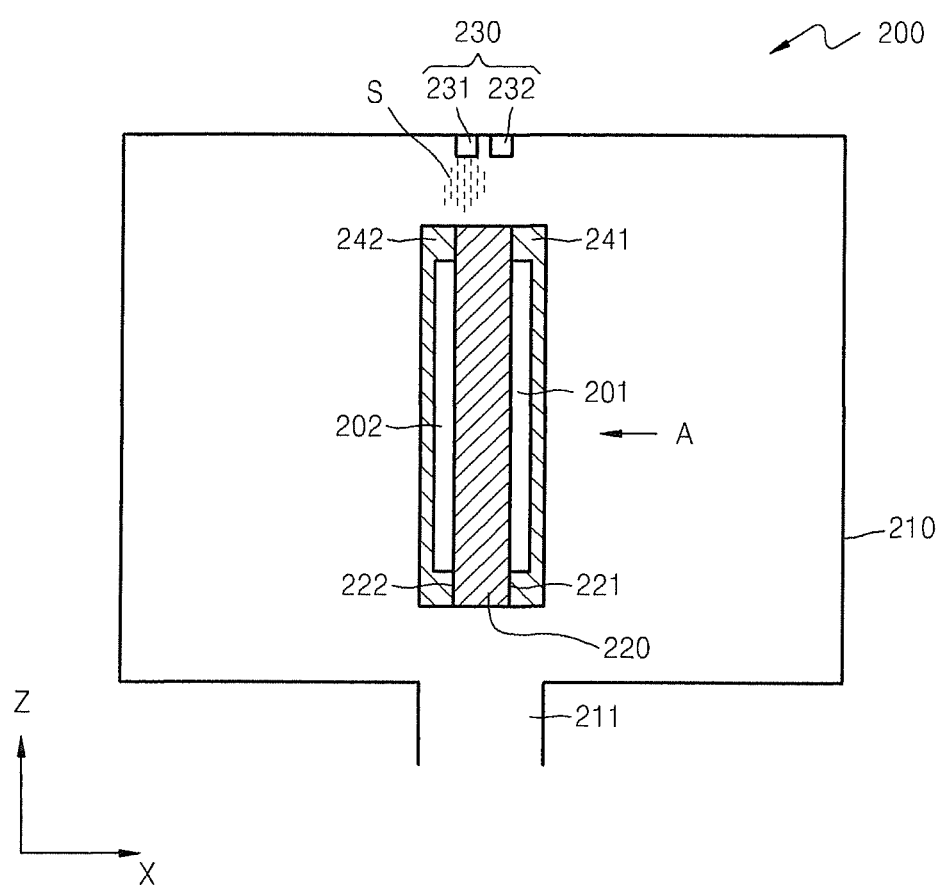
FIG. 2 is a schematic cross-sectional view of a vapor deposition apparatus according to another embodiment of the present invention.
Figure 3:
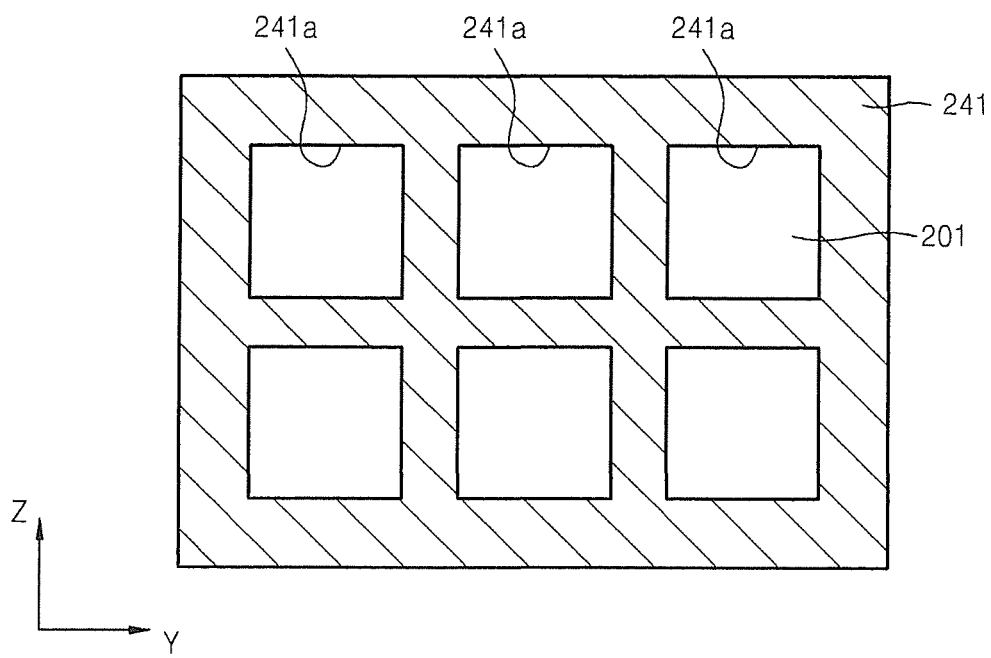
FIG. 3 is a diagram of the vapor deposition apparatus seen from a direction A of FIG. 2.

FIG. 2 is a schematic cross-sectional view of a vapor deposition apparatus according to another embodiment of the present invention, and FIG. 3 is a diagram of the vapor deposition apparatus seen from a direction A of FIG. 2.

Referring to FIGS. 2 and 3, a vapor deposition apparatus 200 includes a chamber 210, a stage 220, an injection unit 230, and masks 241 and 242.

The chamber 210 includes an exhaust opening (e.g., an exhaust hole) 211 on a lower portion thereof. The exhaust opening 211 is an outlet that exhausts gas, and may be coupled (or connected) to a pump so as to perform the exhaustion sufficiently.

Although not shown in FIGS. 2 and 3, the chamber 210 is controlled by a pump so as to maintain a suitable pressure (e.g., a predetermined pressure). In addition, a heating unit (not shown) for heating inside of the chamber 210 may be disposed on an inner or outer portion of the chamber 210 so as to improve efficiency of a thin film deposition process.

The stage 220 is disposed in the chamber 210. The stage 220 includes a first mounting surface 221 and a second mounting surface 222. The first and second mounting surfaces 221 and 222 are disposed in parallel with a direction in which gravity acts. That is, the first and second mounting surfaces 221 and 222 are disposed perpendicularly to ground. To do this, the stage 220 is disposed perpendicularly to the ground.

First and second substrates 201 and 202 are disposed on the stage 220. In more detail, the first substrate 201 is mounted on the first mounting surface 221 of the stage 220, and the second substrate 202 is mounted on the second mounting surface 222 of the stage 220.

The first and second mounting surfaces 221 and 222 are in parallel with each other.

Fixing units (not shown) may be disposed on the first and second mounting surfaces 221 and 222 so that the substrates 201 and 202 may be fixed after being mounted on the first and second mounting surfaces 221 and 222.

First and second masks 241 and 242 are disposed on the first and second substrates 201 and 202. In more detail, the first mask 241 is disposed on the first substrate 201, and the second mask 242 is disposed on the second substrate 202.

FIG. 3 shows the first mask 241. The first mask 241 includes mask openings 241a each having a suitable shape (e.g., predetermined shape), which is a rectangular shape in FIG. 3, but is not limited thereto. The mask opening 241a has a shape that corresponds to a pattern of a thin film that will be formed on the first substrate 201.

FIG. 3 shows six mask openings 241a; however, the present invention is not limited thereto. That is, the number of the mask openings 241a may be determined according to the number of patterns that will be formed on the first substrate 201. For example, the first mask 241 may be formed as an open mask having one mask opening 241a.

Although not shown in FIGS. 2 and 3, the second mask 242 also includes mask openings (not shown) similar to the first mask 241. Detailed descriptions of the mask opening (not shown) will not be provided here because the mask opening is substantially similar to the mask opening 241a of the first mask 241.

The injection unit 230 is disposed to be coupled (or connected) to the chamber 210. One or more gases are injected toward the substrates 201 and 202 through the injection unit 230. In more detail, the injection unit 230 includes a first injection opening (e.g., a first injection hole) 231 and a second injection opening (e.g., a second injection hole) 232, and the first and second injection openings 231 and 232 inject the gas in a direction parallel with surface directions of the substrates 201 and 202. That is, the gas is injected through the first and second injection openings 231 and 232 in parallel with a direction in which gravity acts.

In more detail, the first injection opening 231 is used to inject a source gas S, and a second injection hole 232 is used to inject a reaction gas. While the source gas S is being injected through the first injection hole 231, the reaction gas is not injected through the second injection hole 232, and the reaction gas is injected through the second injection hole 232 after injecting the source gas S through the first injection hole 231.

However, the present invention is not limited thereto. For example, the injection unit 230 may include only one injection opening. The source gas S and the reaction gas may be sequentially injected through the one injection opening.

In addition, a plurality of first injection openings 231 and a plurality of second injection openings 232 may be disposed so that the source gas S and the reaction gas may be injected onto (or near) the first and second substrates 201 and 202 separately.

The first and second injection openings 231 and 232 may be formed in various shapes. That is, the first and second injection openings 231 and 232 may be formed as spots, or lines corresponding to widths of the first and second substrates 201 and 202.

Operations of the vapor deposition apparatus 200 of the present embodiment will now be described.

The first substrate 201 and the second substrate 202 are respectively mounted on the first mounting surface 221 and the second mounting surface 222 of the stage 220. After that, the first mask 241 having the mask openings 241*a* corresponding to the pattern of the thin films that will be formed on the first substrate 201, is disposed on the first substrate 201. The second mask 242 having the mask openings (not shown) corresponding to the pattern of thin films that will be formed on the second substrate 202, is disposed on the second substrate 202.

After that, the source gas S is injected through the first injection opening 231 of the injection unit 230. The source gas S is adsorbed on upper surfaces (e.g., surfaces opposite the surfaces facing the stage 220) of the first and second substrates 201 and 202. In particular, the source gas S is adsorbed on portions of the upper surface of the first substrate 201, which correspond to the mask openings 241*a*. In addition, an exhaustion process is performed by the exhaust opening 211, and then, an atom layer of a single-layered structure or a multi-layered structure formed of the source gas S is formed on the upper surfaces of the first and second substrates 201 and 202. After that, the reaction gas is injected through the second injection opening 232 of the injection unit 230. The reaction gas is adsorbed on the upper surfaces of the first and second substrates 201 and 202. In particular, the reaction gas is adsorbed on the portions of the upper surface of the first substrate 201, which correspond to the mask openings 241*a*.

After that, an exhaustion process is performed through the exhaust opening 211, and then, an atom layer of a single-layered structure or mufti-layered structure is formed on the upper surfaces of the first and second substrates 201 and 202. In particular, the atom layer is formed on the portions of the upper surface of the first substrate 201, which correspond to the mask openings 241*a*. Likewise, an atom layer is formed on portions on the upper surface of the second substrate 202, which correspond to the mask openings (not shown) of the second mask 242.

Therefore, the atom layers having the single-layered structure or the multi-layered structure including components of the source gas S and the reaction gas are formed on the upper surfaces of the first and second substrates 201 and 202.

In the present embodiment, the first and second mounting surfaces 221 and 222 are formed on both surfaces of the stage 220, and the first and second substrates 201 and 202 are concurrently (e.g., simultaneously) mounted on one stage 220. In addition, the first and second masks 241 and 242 are disposed on the first and second substrates 201 and 202 so that the desired deposition patterns may be formed easily.

In addition, the first and second masks 241 and 242 function as obstacles for preventing the source gas S or the reaction gas components from being unnecessarily adsorbed on the substrates 201 and 202 when the source or reaction gas is injected into the chamber 210. In addition, characteristics of the thin film formed by the vapor deposition apparatus 200 are further improved.

Figure 4:
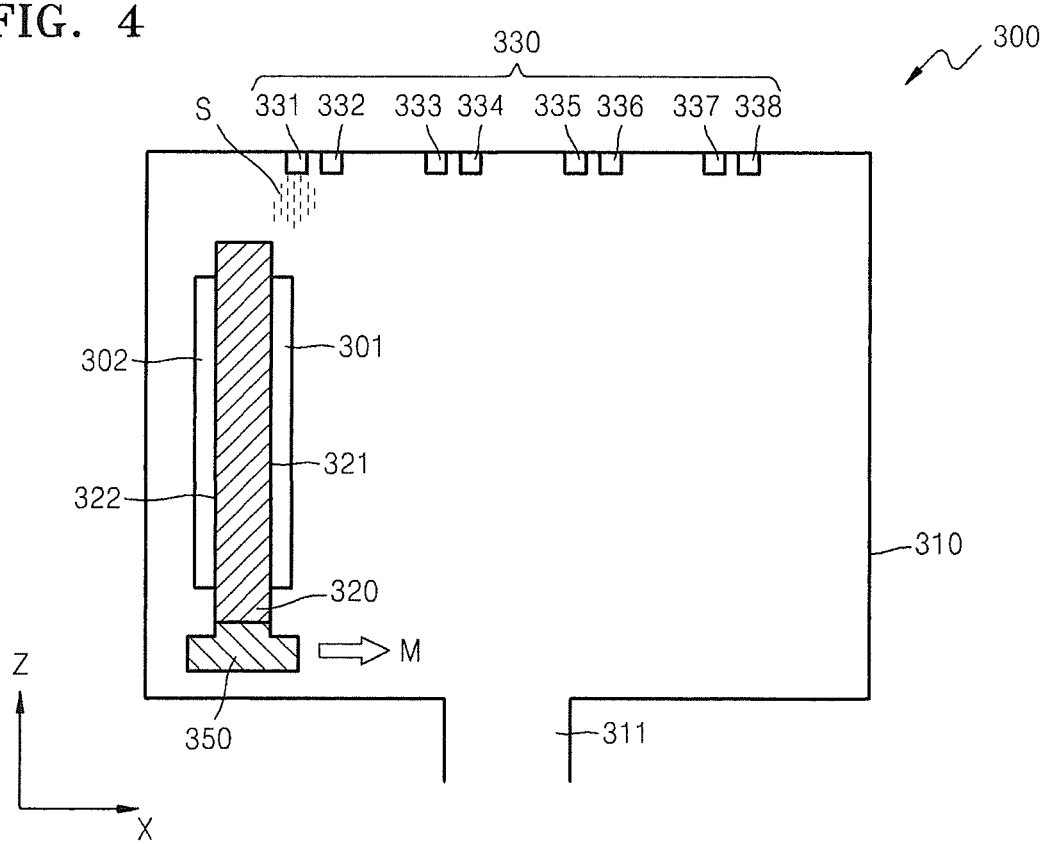
FIG. 4 is a schematic cross-sectional view of a vapor deposition apparatus according to another embodiment of the present invention.

FIG. 4 is a schematic cross-sectional view of a vapor deposition apparatus 300 according to another embodiment of the present invention.

Referring to FIG. 4, the vapor deposition apparatus 300 includes a chamber 310, a stage 320, an injection unit 330, and a driving unit 350.

The chamber 310 includes an exhaust opening (e.g., an exhaust hole) 311 on a lower portion thereof. The exhaust opening 311 is an outlet that exhausts gas, and may be coupled (or connected) to a pump so as to perform the exhaustion sufficiently.

Although not shown in FIG. 4, the chamber 310 is controlled by a pump so as to maintain a suitable pressure (e.g., a predetermined pressure). In addition, a heating unit (not shown) for heating inside of the chamber 310 may be disposed on an inner or outer portion of the chamber 310 so as to improve an efficiency of a thin film deposition process.

The stage 320 is disposed in the chamber 310. The stage 320 includes a first mounting surface 321 and a second mounting surface 322. The first and second mounting surfaces 321 and 322 are disposed in parallel with a direction in which gravity acts. That is, the first and second mounting surfaces 321 and 322 are disposed perpendicularly to ground. To do this, the stage 320 is disposed perpendicularly to the ground.

First and second substrates 301 and 302 are disposed on the stage 320. In more detail, the first substrate 301 is mounted on the first mounting surface 321 of the stage 320, and the second substrate 302 is mounted on the second mounting surface 322 of the stage 320.

The first and second mounting surfaces 321 and 322 are in parallel with each other.

Fixing units (not shown) may be disposed on the first and second mounting surfaces 321 and 322 so that the substrates 301 and 302 may be fixed after being mounted on the first and second mounting surfaces 321 and 322. The fixing unit (not shown) may be a clamp, a compressing unit, an adhesive material, or other materials.

The driving unit 350 is coupled (or connected) to the stage 320. The driving unit 350 conveys the stage 320 in a direction M shown in FIG. 4, or an opposite direction to the direction M. That is, the driving unit 350 conveys the stage 320 in an X-axis direction of FIG. 4. Thus, the first and second substrates 301 and 302 may be moved in a direction perpendicular to upper surfaces (e.g., surfaces opposite the surfaces facing the stage 320) of the first and second substrates 301 and 302, that is, the surfaces on which the thin film will be formed.

The injection unit 330 is coupled (or connected) to the chamber 310. One or more gases are injected toward the first and second substrates 301 and 302 through the injection unit 330. In more detail, the injection unit 330 includes a first injection opening (e.g., a first injection hole) 331, a second injection opening (e.g., a second injection hole) 332, a third injection opening (e.g., a third injection hole) 333, a fourth injection opening (e.g., a fourth injection hole) 334, a fifth injection opening (e.g., a fifth injection hole) 335, a sixth injection opening (e.g., a sixth injection hole) 336, a seventh injection opening (e.g., a seventh injection hole) 337, and an eighth injection opening (e.g., an eighth injection hole) 338.

In addition, the first through eighth injection openings 331 through 338 are arranged along a moving direction of the first and second substrates 301 and 302. That is, the first through eighth injection openings 331 through 338 are arranged along the X-axis direction of FIG. 4, and are spaced from each other.

The gas is injected into the chamber 310 through the first through eighth injection openings 331 through 338 in parallel with surface directions of the substrates 301 and 302. That is, the gas is injected through the first through eighth injection openings 331 through 338 in parallel with a direction in which gravity acts.

In more detail, the source gas S is injected through the first, third, fifth, and seventh injection openings 331, 333, 335, and 337, and the reaction gas is injected through the second, fourth, sixth, and eighth injection openings 332, 334, 336, and 338.

While the source gas S is being injected through the first, third, fifth, and seventh injection openings 331, 333, 335, and 337, the reaction gas is not injected through the second, fourth, sixth, and eighth injection openings 332, 334, 336, and 338. After injecting the source gas S through the first, third, fifth, and seventh injection openings 331, 333, 335, and 337, the reaction gas is injected through the second, fourth, sixth, and eighth injection openings 332, 334, 336, and 338.

In addition, the source gas S may be sequentially or concurrently (e.g., simultaneously) injected through the first, third, fifth, and seventh injection openings 331, 333, 335, and 337. Likewise, the reaction gas may be injected sequentially or concurrently (e.g., simultaneously) injected through the second, fourth, sixth, and eighth injection openings 332, 334, 336, and 338.

However, the present invention is not limited to the above example. That is, the source gas S and the reaction gas may be injected through the same injection openings of the injection unit 330. For example, the injection unit 330 may include the first, third, fifth, and seventh injection openings 331, 333, 335, and 337, and the source gas S may be sequentially injected through the first, third, fifth, and seventh injection openings 331, 333, 335, and 337, and then the reaction gas may be injected.

Although not shown in FIG. 4, the first through eighth injection openings 331 through 338 may be spaced at regular intervals from each other. For example, after injecting the source gas S, the reaction gas may be injected after moving the substrates 301 and 302 by using the driving unit 350.

In addition, the first through eighth injection openings 331 through 338 may be formed to have various shapes, for example, may be formed as spots or lines corresponding to widths of the first and second substrates 301 and 302.

Operations of the vapor deposition apparatus 300 of the present embodiment will now be described.

The first substrate 301 and the second substrate 302 are mounted on the first mounting surface 321 and the second mounting surface 322 of the stage 320.

After that, the source gas S is injected through the first injection opening 331 of the injection unit 330. The source gas S is adsorbed on upper surfaces (i.e., surfaces opposite the surfaces facing the stage 320) of the first and second substrates 301 and 302. After that, an exhaustion process is performed through the exhaust opening 311, and then an atom layer of a single-layered structure or multi-layered structure formed of the source gas S, is formed on the upper surfaces of the first and second substrates 301 and 302.

After that, the reaction gas is injected through the second injection hole 332 of the injection unit 330. The reaction gas is adsorbed on the upper surfaces of the first and second substrates 301 and 302. Then, an exhaustion process is performed through the exhaust opening 311, and then, an atom layer of the single-layered structure or multi-layered structure formed of the reaction gas is formed on the upper surfaces of the first and second substrates 301 and 302.

Therefore, the atom layers of the single-layered structure or the multi-layered structure formed of the source gas S and the reaction gas components are formed on the upper surfaces of the first and second substrates 301 and 302.

After that, the stage 320 is moved in the X-axis direction of FIG. 4, that is, in a direction denoted by the arrow M, by using the driving unit 350. The source gas S is injected through the third injection opening 333 of the injection unit. The source gas S is adsorbed on the upper surfaces of the first and second substrates 301 and 302. After that, the exhaustion process is performed through the exhaust opening 311, and then, an atom layer of a single-layered structure or multi-layered structure formed of the source gas S is formed on the upper surfaces of the first and second substrates 301 and 302.

In addition, the reaction gas is injected through the fourth injection opening 334 of the injection unit 330. The reaction gas is adsorbed on the upper surfaces of the first and second substrates 301 and 302. Then, an exhaustion process is performed through the exhaust opening 311, and then, an atom layer of the single-layered structure or multi-layered structure formed of the reaction gas is formed on the upper surfaces of the first and second substrates 301 and 302.

Through the above processes, the atom layers of the single-layered structure or the multi-layered structure including the source gas S and the reaction gas components are additionally formed on thin films that are formed on the upper surfaces of the first and second substrates 301 and 302 through the first and second injection openings 331 and 332.

Then, the stage 320 is moved in the X-axis direction of FIG. 4, that is, in the direction denoted by the arrow M, by using the driving unit 350. Thin films are additionally formed on the first and second substrates 301 and 302 by using the fifth and sixth injection openings 335 and 336, like the first and second injection openings 331 and 332.

After that, the stage 320 is further moved in the X-axis direction of FIG. 4, that is, the direction denoted by the arrow M, by using the driving unit 350. Then, thin films are further formed on the first and second substrates 301 and 302 by using the seventh and eighth injection openings 337 and 338, like the first and second injection openings 331 and 332.

In addition, the deposition process may be further performed in an opposite order of the above processes while moving the stage 320 in the X-axis direction of FIG. 4, that is, in the direction opposite to the arrow M, by using the driving unit 350. After that, the deposition process may be further performed while moving the stage 320 in the X-axis direction of FIG. 4, that is, in the direction denoted by the arrow M.

Through the above processes, thin films of desired thickness may be easily formed on the first and second substrates 301 and 302 in one chamber 310. That is, a moving distance of the stage 320 may be adjusted according to the desired thickness of the thin film.

Although not shown in FIG. 4, according to embodiments of the present invention, the first through eighth injection openings 331 through 338 may be separated at regular intervals. According to the above arrangement, the gas is sequentially injected through the injection openings 331 through 338, and then, the driving unit 350 may be moved in the direction denoted by the arrow M.

The gas is injected from the injection unit 330 in a direction parallel with the upper surfaces of the substrates 301 and 302. In particular, the first and second substrates 301 and 302 are disposed perpendicularly to the ground, that is, in a direction in which gravity acts. Therefore, when the gas is injected through the injection unit 330 and adsorbed on the substrates 301 and 302, an unnecessarily adsorbed amount on the substrates 301 and 302 may be reduced. That is, unnecessarily adsorbed components on the substrates 301 and 302 and other unevenly lumped components fall down due to gravity, and thus, the unnecessary amount is reduced. In addition, the unnecessary gas components may be easily removed by the exhaustion process through the exhaust opening 311 disposed on a lower portion of the first and second substrates 301 and 302. Therefore, after injecting the source gas S through the first injection opening 331 of the injection unit 330, the exhaustion process is performed without performing a purging process using an additional purge gas. After that, the reaction gas is injected through the second injection opening 332, the exhaustion process is performed without performing the purging process using an additional purge gas, and then, the deposition process is finished.

As a result, efficiency of the deposition process for forming desired thin films may be improved greatly. In addition, adsorption of the unnecessary gas components may be reduced or prevented, and mixture of purge gas impurities into the thin films formed on the substrates 301 and 302 may be reduced or prevented. Therefore, the thin films may be evenly formed, and may have excellent physical and chemical characteristics.

According to the present embodiment, the first and second mounting surfaces 321 and 322 are formed on both surfaces of the stage 320, and the first and second substrates 301 and 302 are formed on one stage 320 concurrently (e.g., simultaneously). Therefore, the processing efficiency may be further improved. In addition, the first and second substrates 301 and 302 are disposed on the stage 320 in parallel with each other, and thus, the surfaces on which the first and second substrates 301 and 302 are formed do not face each other, and the thin film deposition processes formed on each of the surfaces do not affect each other. Thus, uniform and excellent thin films may be formed on both substrates 301 and 302 concurrently (e.g., simultaneously).

In addition, in the present embodiment, the stage 320 is moved by using the driving unit 350. Therefore, the deposition process is performed while moving the first and second substrates 301 and 302. That is, the deposition processes are sequentially performed through the first through eighth injection openings 331 through 338, and thus, a time taken to form the thin film of desired thickness may be greatly reduced and the convenience with respect to performing processes may be improved.

Figure 5:
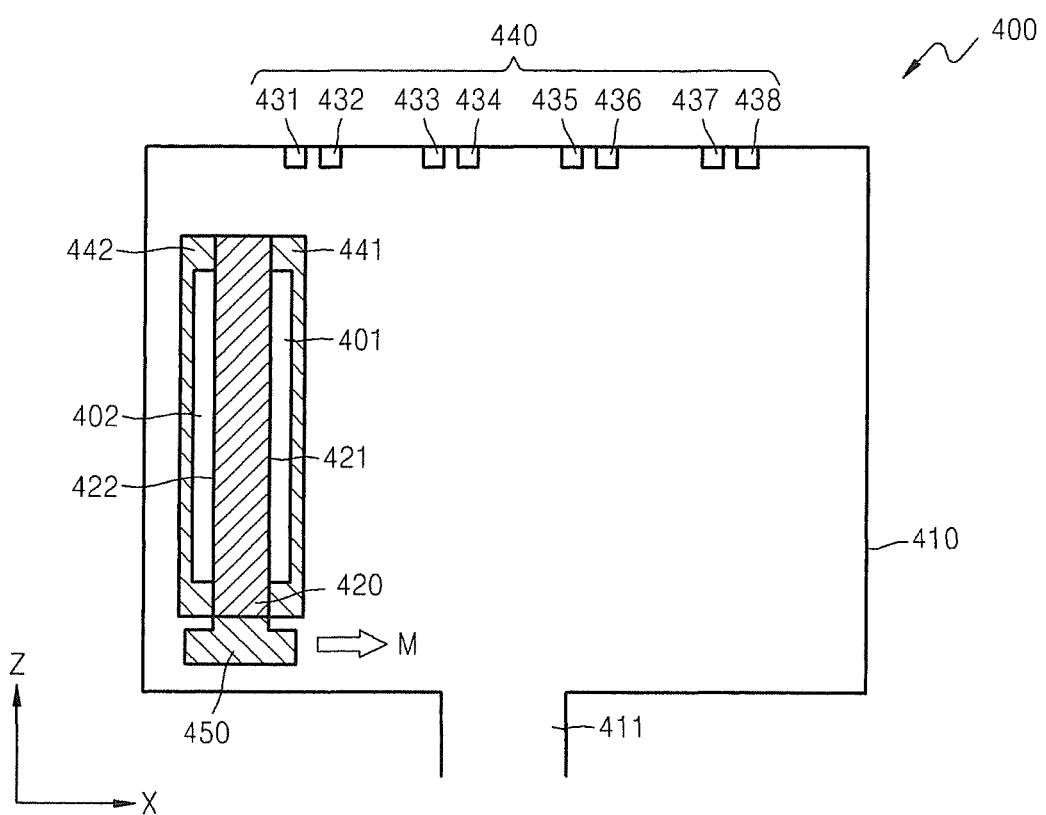
FIG. 5 is a schematic cross-sectional view of a vapor deposition apparatus according to another embodiment of the present invention.

FIG. 5 is a schematic cross-sectional view of a vapor deposition apparatus 400 according to another embodiment of the present invention.

Referring to FIG. 5, the vapor deposition apparatus 400 includes a chamber 410, a stage 420, an injection unit 430, masks 441 and 442, and a driving unit 450.

The chamber 410 includes an exhaust opening (e.g., an exhaust hole) 411 on a lower portion thereof. The exhaust opening 411 is an outlet that exhausts gas, and may be coupled (or connected) to a pump so as to perform the exhaustion sufficiently.

Although not shown in FIG. 5, the chamber 410 is controlled by a pump so as to maintain a suitable pressure (e.g., a predetermined pressure). In addition, a heating unit (not shown) for heating inside of the chamber 410 may be disposed on inner or outer portion of the chamber 410 so as to improve efficiency of a thin film deposition process.

The stage 420 is disposed in the chamber 410. The stage 420 includes a first mounting surface 421 and a second mounting surface 422. The first and second mounting surfaces 421 and 422 are disposed in parallel with a direction in which gravity acts. That is, the first and second mounting surfaces 421 and 422 are disposed perpendicular to ground. To do this, the stage 420 is disposed perpendicularly to the ground.

First and second substrates 401 and 402 are disposed on the stage 420. In more detail, the first substrate 401 is mounted on the first mounting surface 421 of the stage 420, and the second substrate 402 is mounted on the second mounting surface 422 of the stage 420.

The first and second mounting surfaces 421 and 422 are in parallel with each other.

Fixing units (not shown) may be disposed on the first and second mounting surfaces 421 and 422 so that the substrates 401 and 402 may be fixed after being mounted on the first and second mounting surfaces 421 and 422. The fixing unit (not shown) may be a clamp, a compressing unit, an adhesive material, or other suitable materials known to those skilled in the art.

First and second masks 441 and 442 are disposed on the first and second substrates 401 and 402. In more detail, the first mask 441 is disposed on the first substrate 401, and the second mask 442 is disposed on the second substrate 402.

As shown in FIG. 3, the first and second masks 441 and 442 respectively include openings (not shown) each having a suitable shape (e.g., a predetermined shape), which corresponds to a pattern of a thin film that will be formed on each of the first and second substrates 401 and 402.

The driving unit 450 is coupled (or connected) to the stage 420. The driving unit 450 conveys the stage 420 in a direction denoted by an arrow M shown in FIG. 5, or in an opposite direction to the direction M. That is, the driving unit 450 conveys the stage 420 in an X-axis direction of FIG. 5. Thus, the first and second substrates 401 and 402 may be moved in a direction perpendicular to upper surfaces of the first and second substrates 401 and 402, that is, the surfaces on which the thin film will be formed.

The injection unit 430 is coupled (or connected) to the chamber 410. One or more gases are injected toward the first and second substrates 401 and 402 through the injection unit 430. In more detail, the injection unit 430 includes a first injection opening (e.g., a first injection hole) 431, a second injection opening (e.g., a second injection hole) 432, a third injection opening (e.g., a third injection hole) 433, a fourth injection opening (e.g., a fourth injection hole) 434, a fifth injection opening (e.g., a fifth injection hole) 435, a sixth injection opening (e.g., a sixth injection hole) 436, a seventh injection opening (e.g., a seventh injection hole) 437, and an eighth injection opening (e.g., an eighth injection hole) 438.

In addition, the first through eighth injection openings 431 through 438 are arranged along a moving direction of the first and second substrates 401 and 402. That is, the first through eighth injection openings 431 through 438 are arranged in the X-axis direction of FIG. 5 to be separated from each other.

The gas is injected into the chamber 410 through the first through eighth injection openings 431 through 438 in parallel with surface directions of the substrates 401 and 402. That is, the gas is injected through the first through eighth injection openings 431 through 438 in parallel with a direction in which gravity acts.

In more detail, the source gas S is injected through the first, third, fifth, and seventh injection openings 431, 433, 435, and 437, and the reaction gas is injected through the second, fourth, sixth, and eighth injection openings 432, 434, 436, and 438.

While the source gas S is being injected through the first, third, fifth, and seventh injection openings 431, 433, 435, and 437, the reaction gas is not injected through the second, fourth, sixth, and eighth injection openings 432, 434, 436, and 438. After injecting the source gas S through the first, third, fifth, and seventh injection openings 431, 433, 435, and 437, the reaction gas is injected through the second, fourth, sixth, and eighth injection openings 432, 434, 436, and 438.

In addition, the source gas S may be sequentially or concurrently (e.g., simultaneously) injected through the first, third, fifth, and seventh injection openings 431, 433, 435, and 437. Likewise, the reaction gas may be injected sequentially or concurrently (e.g., simultaneously) injected through the second, fourth, sixth, and eighth injection openings 432, 434, 436, and 438.

However, the present invention is not limited to the above example. That is, the source gas S and the reaction gas may be injected through the same injection openings of the injection unit 430. For example, the injection unit 430 may include the first, third, fifth, and seventh injection openings 431, 433, 435, and 437, and the source gas S is sequentially injected through the first, third, fifth, and seventh injection openings 431, 433, 435, and 437, and then the reaction gas may be injected.

Operations of the vapor deposition apparatus 400 of the present embodiment will be described as follows.

The first and second substrates 401 and 402 are mounted on the first and second mounting surfaces 421 and 422 of the stage 420. The first mask 441 having the mask openings (not shown) corresponding to the pattern of the thin films that will be formed on the first substrate 401 is disposed on the first substrate 401. The second mask 441 having the mask openings (not shown) corresponding to the pattern of the thin film that is to be formed on the second substrate 402 is disposed on the second substrate 402.

The source gas S is injected through the first injection opening 431 of the injection unit 430. The source gas S is adsorbed on the upper surfaces of the first and second substrates 401 and 402, in particular, portions corresponding to the mask openings (not shown) of the first and second masks 441 and 442. After that, an exhaustion process through the exhaust opening 411 is performed, and then, an atom layer of single-layered structure or multi-layered structure including the source gas S, is formed on the upper surfaces of the first and second substrates 401 and 402.

After that, the reaction gas is injected through the second injection opening 432 of the injection unit 430. The reaction gas is adsorbed on the upper surfaces of the first and second substrates 401 and 402, in particular, on portions corresponding to the mask openings (not shown) of the first and second masks 441 and 442. Then, an exhaustion process is performed through the exhaust opening 411, and then, an atom layer of the single-layered structure or multi-layered structure formed of the reaction gas is formed on the upper surfaces of the first and second substrates 401 and 402.

Therefore, the atom layers of the single-layered structure or the multi-layered structure formed of the source gas S and the reaction gas components are formed on the upper surfaces of the first and second substrates 401 and 402, in particular, the portions corresponding to the mask openings (not shown) of the first and second masks 441 and 442.

After that, the stage 420 is moved in the X-axis direction of FIG. 5, that is, in a direction denoted by the arrow M, by using the driving unit 450. The source gas S is injected through the third injection opening 433 of the injection unit 430. The source gas S is adsorbed on the upper surfaces of the first and second substrates 401 and 402. After that, the exhaustion process is performed through the exhaust opening 411, and then, an atom layer of a single-layered structure or multi-layered structure formed of the source gas S is formed on the upper surfaces of the first and second substrates 401 and 402.

In addition, the reaction gas is injected through the fourth injection opening 434 of the injection unit 430. The reaction gas is adsorbed on the upper surfaces of the first and second substrates 401 and 402. Then, an exhaustion process is performed through the exhaust opening 411, and then, an atom layer of the single-layered structure or multi-layered structure formed of the reaction gas is formed on the upper surfaces of the first and second substrates 401 and 402.

Through the above processes, the atom layers of the single-layered structure or the multi-layered structure including the source gas S and the reaction gas components are additionally formed on portions corresponding to the mask openings (not shown) of the first and second masks 441 and 442, on thin films that are formed on the upper surfaces of the first and second substrates 401 and 402 through the first and second injection openings 431 and 432.

Then, the stage 420 is moved in the X-axis direction of FIG. 5, that is, in the direction denoted by the arrow M, by using the driving unit 450. Thin films are additionally formed on the portions, corresponding to the mask openings (not shown), on the first and second substrates 401 and 402 by using the fifth and sixth injection openings 435 and 436, like the first and second injection openings 431 and 432.

After that, the stage 420 is further moved in the X-axis direction of FIG. 5, that is, the direction denoted by the arrow M, by using the driving unit 450. Then, thin films are further formed on the portions, which correspond to the mask openings (not shown), of the first and second substrates 401 and 402 by using the seventh and eighth injection openings 437 and 438, like the first and second injection openings 431 and 432.

In addition, the deposition process may be further performed in an opposite order of the above processes while moving the stage 420 in the X-axis direction of FIG. 5, that is, in the direction opposite to the arrow M, by using the driving unit 450. After that, the deposition process may be further performed while moving the stage 420 in the X-axis direction of FIG. 5, that is, in the direction denoted by the arrow M.

Through the above processes, thin films of desired thickness may be easily formed on the first and second substrates 401 and 402 in one chamber 410. That is, a moving distance of the stage 420 may be adjusted according to the desired thickness of the thin film.

In addition, in the present embodiment, the stage 420 is moved by using the driving unit 450. Therefore, the deposition process is performed while moving the first and second substrates 401 and 402. That is, the deposition processes are sequentially performed through the first through eighth injection openings 431 through 438, and thus, a time taken to form the thin film of desired thickness is greatly reduced and convenience with respect to performing processes is improved.

The first and second masks 441 and 442 are disposed on the first and second substrates 401 and 402 to form desired patterns easily.

In addition, the first and second masks 441 and 442 function as obstacles for preventing the source gas S or the reaction gas components from being unnecessarily adsorbed on the substrates 401 and 402 when the source or reaction gas is injected into the chamber 410. In addition, characteristics of the thin film formed by the vapor deposition apparatus 400 may be further improved.

Figure 6:
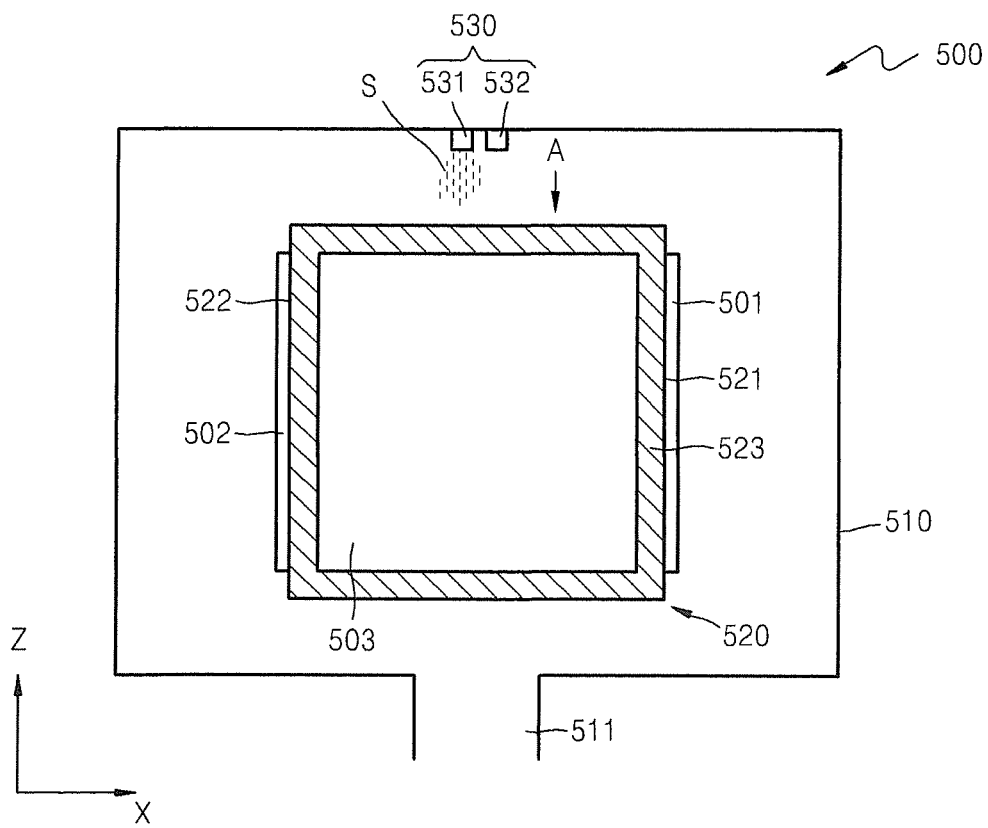
FIG. 6 is a schematic cross-sectional view of a vapor deposition apparatus according to another embodiment of the present invention.
Figure 7:
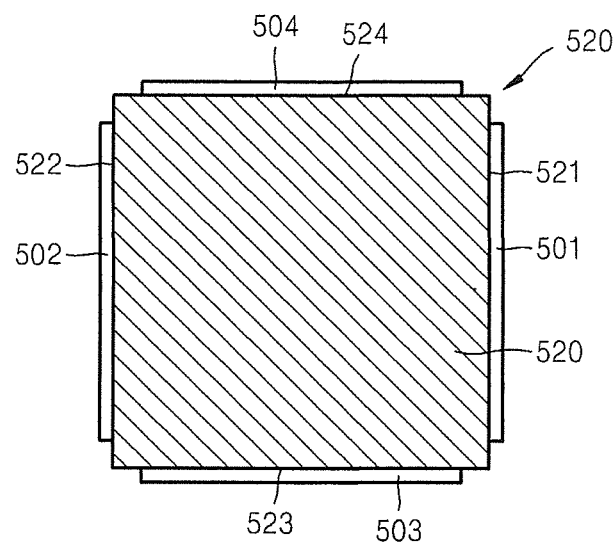
FIG. 7 is a diagram of the vapor deposition apparatus seen from a direction A of FIG. 6.

FIG. 6 is a schematic cross-sectional view of a vapor deposition apparatus 500 according to another embodiment of the present invention, and FIG. 7 is a diagram of the vapor deposition apparatus seen from a direction A of FIG. 6.

Referring to FIGS. 6 and 7, the vapor deposition apparatus 500 includes a chamber 510, a stage 520, and an injection unit 530.

The chamber 510 includes an exhaust opening 511 on a lower portion thereof. The exhaust opening 511 is an outlet that exhausts gas, and may be coupled (or connected) to a pump so as to perform the exhaustion sufficiently.

Although not shown in FIG. 6, the chamber 510 is controlled by a pump so as to maintain a suitable pressure (e.g., a predetermined pressure). In addition, a heating unit (not shown) for heating inside of the chamber 510 may be disposed on an inner or outer portion of the chamber 510 so as to improve efficiency of a thin film deposition process.

The stage 520 is disposed in the chamber 510. The stage 520 includes a first mounting surface 521, a second mounting surface 522, a third mounting surface 523, and a fourth mounting surface 524. The stage 520 has four side surfaces, on which the first through fourth mounting surfaces 521 through 524 are respectively disposed.

The first through fourth mounting surfaces 521 through 524 are disposed in parallel with a direction in which gravity acts. That is, the first through fourth mounting surfaces 521 through 524 are disposed perpendicularly to the ground. To do this, the stage 520 is disposed perpendicularly to the ground.

Referring to FIGS. 6 and 7, the stage 520 has a shape similar to a rectangular parallelepiped. However, the present invention is not limited thereto. That is, the stage 520 may be formed as various polygons having a plurality of side surfaces that are perpendicular to the ground, and the mounting surfaces are disposed on the side surfaces.

A first substrate 501, a second substrate 502, a third substrate 503, and a fourth substrate 504 are disposed on the stage 520. In more detail, the first substrate 501 is mounted on the first mounting surface 521 of the stage 520, the second substrate 502 is mounted on the second mounting surface 522 of the stage 520, the third substrate 503 is mounted on the third mounting surface 523 of the stage 520, and the fourth substrate 504 is mounted on the fourth mounting surface 524 of the stage 520.

The first and second mounting surfaces 521 and 522 are parallel with each other, and the third and fourth mounting surfaces 523 and 524 are parallel with each other.

Fixing units (not shown) may be disposed on the first through fourth mounting surfaces 521 through 524 so that the first through fourth substrates 501 through 504 may be fixed after being mounted on the first through fourth mounting surfaces 521 through 524. The fixing unit (not shown) may be a clamp, a compressing unit, an adhesive material, or other suitable materials known to those skilled in the art.

The injection unit 530 is disposed to be coupled (or connected) to the chamber 510. One or more gases are injected toward the substrates 501 and 502 through the injection unit 530. In more detail, the injection unit 530 includes a first injection opening (e.g., a first injection hole) 531 and a second injection opening (e.g., a second injection hole) 532, and the first and second injection openings 531 and 532 inject the gas in a direction parallel with surface directions of the substrates 501 and 502. That is, the gas is injected through the first and second injection openings 531 and 532 in parallel with a direction in which gravity acts.

In more detail, the first injection opening 531 is used to inject a source gas S, and a second injection opening 532 is used to inject a reaction gas. While the source gas S is being injected through the first injection opening 531, the gas is not injected through the second injection opening 532, and the reaction gas is injected through the second injection opening 532 after injecting the source gas S through the first injection opening 531.

However, the present invention is not limited thereto. That is, the injection unit 530 may include only one injection opening. The source gas S and the reaction gas may be sequentially injected through one injection opening.

In addition, a plurality of first injection openings 531 and a plurality of second injection openings 532 may be disposed so that the source gas S and the reaction gas may be injected onto (or near) the first through fourth substrates 501 through 504 separately.

According to the present embodiment, the gas is injected from the injection unit 530 in a direction parallel with the upper surfaces of the first through fourth substrates 501 through 504. In particular, the first through fourth substrates 501 through 504 are disposed in a direction perpendicular to the ground, that is, a direction in which gravity acts. Therefore, when the gas is injected through the injection unit 530 and adsorbed on the first through fourth substrates 501 through 504, an unnecessarily adsorbed amount on the first through fourth substrates 501 through 504 may be reduced. That is, unnecessary adsorbed components on the first through fourth substrates 501 through 504 and other unevenly lumped components fall down due to gravity, and thus, the unnecessary amount is reduced. In addition, the unnecessary gas components may be easily removed by the exhaustion process through the exhaust opening 511 disposed on a lower portion of the first through fourth substrates 501 through 504. Therefore, after injecting the source gas S through the first injection opening 531 of the injection unit 530, the exhaustion process is performed without performing a purging process using an additional purge gas. After that, the reaction gas is injected through the second injection opening 532, the exhaustion process is performed without performing the purging process using an additional purge gas, and then, the deposition process is finished.

As a result, efficiency of the deposition process for forming desired thin films may be improved greatly. In addition, adsorption of the unnecessary gas components may be reduced or prevented, and mixture of purge gas impurities into the thin films formed on the first through fourth substrates 501 through 504 may be reduced or prevented. Therefore, the thin films may be evenly formed, and have excellent physical and chemical characteristics.

In addition, according to embodiments of the present invention, four mounting surfaces 521 through 524 are formed on the side surfaces of the stage 520, and four substrates 501 through 504 are mounted on one stage concurrently (e.g., simultaneously). Therefore, the processing efficiency is further improved.

Also, the first and second substrates 501 and 502 are disposed on one stage 520 in parallel with each other, and the third and fourth substrates 503 and 504 are disposed in parallel with each other. Thus, the surfaces of the four substrates 501 through 504, on which thin films are formed, do not face each other, and thus, the thin film deposition processes respectively performed on each substrate do not affect each other. Therefore, uniform and excellent thin films may be formed concurrently (e.g., simultaneously) on each of the first through fourth substrates 501 through 504.

Figure 8:
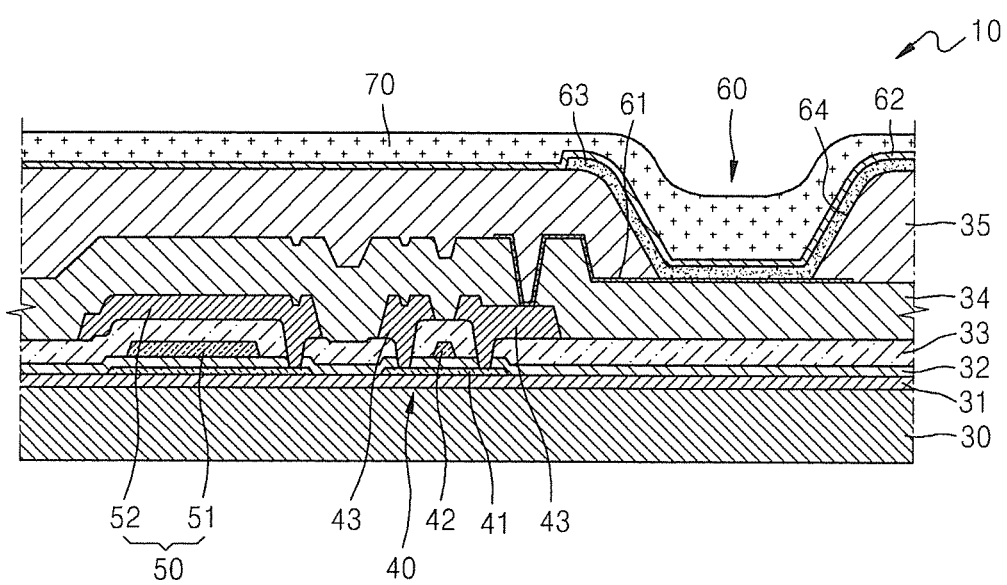
FIG. 8 is a schematic cross-sectional view of an organic light emitting display apparatus manufactured by an organic light emitting display apparatus manufacturing method according to an embodiment of the present invention.

FIG. 8 is a schematic cross-sectional view of an organic light emitting display apparatus 10 manufactured by an organic light emitting display apparatus manufacturing method according to an embodiment of the present invention. In more detail, the organic light emitting display apparatus 10 of FIG. 8 is manufactured by using the vapor deposition apparatus 100, 200, 300, 400, or 500 according to an embodiment of the present invention.

Referring to FIG. 8, the organic light emitting display apparatus 10 is formed on a substrate 30. The substrate 30 may be formed of a glass material, a plastic material, or a metal material. A buffer layer 31 that forms a flat surface on an upper portion of the substrate 30 and includes an insulating material for preventing moisture and impurities from infiltrating into the substrate 30, is formed on the substrate 30.

A thin film transistor (TFT) 40, a capacitor 50, and an organic light emitting device 60 are formed on the buffer layer 31. The TFT 40 includes an active layer 41, a gate electrode 42, and source/drain electrodes 43. The organic light emitting device 60 includes a first electrode 61, a second electrode 62, and an intermediate layer 63.

In more detail, the active layer 41 (e.g., the active layer having a predetermined pattern) is formed on the buffer layer 31. The active layer 41 may be a p-type or an n-type semiconductor. A gate insulating layer 32 is formed on the active layer 41. The gate electrode 42 is formed on the gate insulating layer 32 to correspond to the active layer 41. An interlayer dielectric 33 is formed to cover the gate electrode 42. The source/drain electrodes 43 are formed on the interlayer dielectric 33 so as to contact a region (e.g., a predetermined region) of the active layer 41. A passivation layer 34 is formed to cover the source/drain electrodes 43, and an insulating layer may be additionally formed on the passivation layer 34 for planarizing the passivation layer 34.

The first electrode 61 is formed on the passivation layer 34. The first electrode 61 is electrically connected to the drain electrode 43. In addition, a pixel defining layer 35 is formed to cover the first electrode 61. An opening (e.g., a predetermined opening) 64 is formed in the pixel defining layer 35, and the intermediate layer 63 including an organic emission layer is formed on a portion defined by the opening 64. The second electrode 62 is formed on the intermediate layer 63.

An encapsulation layer 70 is formed on the second electrode 62. The encapsulation layer 70 may include an organic or an inorganic material, or may include the organic and inorganic materials stacked alternately.

The encapsulation layer 70 may be formed by using the vapor deposition apparatus 100, 200, 300, 400, or 500. That is, the substrate 30 on which the second electrode 62 is formed is conveyed to the chamber, and the vapor deposition process is performed to form the encapsulation layer 70.

However, the present invention is not limited thereto. That is, other insulating layers of the organic light emitting display apparatus 10 such as the buffer layer 31, the gate insulating layer 32, the interlayer dielectric 33, the passivation layer 34, and the pixel defining layer 35 may be formed by using the vapor deposition apparatus according to embodiments of the present invention.

Also, various conductive thin films such as the active layer 41, the gate electrode 42, the source/drain electrodes 43, the first electrode 61, the intermediate layer 63, and the second electrode 62 may be formed by using the vapor deposition apparatus according to embodiments of the present invention.

According to the vapor deposition apparatus, the vapor deposition method, and the method of manufacturing the organic light emitting display apparatus of embodiments of the present invention, a deposition process may be performed efficiently and characteristics of formed thin films may be improved.

While the present invention has been particularly shown and described with reference to exemplary embodiments thereof, it will be understood by those of ordinary skill in the art that various changes in form and details may be made therein without departing from the spirit and scope of the present invention as defined by the following claims and their equivalents.

What is claimed is:

1. A vapor deposition apparatus for forming a thin film on a plurality of substrates, the apparatus comprising:
 a chamber having an exhaust opening;
 a stage in the chamber, and comprising a plurality of mounting surfaces adapted for the plurality of substrates to be mounted thereon;
 an injection unit having at least one injection opening for injecting a gas into the chamber in a direction parallel with surfaces of the plurality of substrates; and
 a driving unit configured to drive the stage to move the substrates in a direction normal to the surfaces of the plurality of substrates while the gas is being injected into the chamber.

2. The apparatus of claim 1, wherein the plurality of mounting surfaces are disposed in the direction parallel with surfaces of the plurality of substrates.

3. The apparatus of claim 1, wherein the injection unit is disposed above the stage.

4. The apparatus of claim 1, wherein the plurality of mounting surfaces comprises at least two mounting surfaces that are disposed in parallel with each other.

5. The apparatus of claim 1, wherein the exhaust opening is coupled to a pump.

6. The apparatus of claim 1, wherein a source gas and a reaction gas are sequentially injected through the injection opening.

7. The apparatus of claim 1, wherein the injection unit has a plurality of injection openings through which a source gas and a reaction gas are independently injected.

8. The apparatus of claim 1, wherein the exhaust opening is closer to the bottom of the chamber than the substrates are.

9. The apparatus of claim 1, further comprising a mask having a mask opening for forming the thin film on the substrates in a desired pattern,
 wherein the mask is disposed on the substrates.

10. The apparatus of claim 1, wherein the driving unit conveys the substrates in a direction normal to a surface of the substrates, on which the thin film is to be formed.

11. The apparatus of claim 1, wherein the driving unit reciprocally conveys the substrates in a direction normal to a surface of the substrates, on which the thin film is to be formed.

12. The apparatus of claim 1, wherein the injection unit has a plurality of injection openings that are separated from each other along a direction in which the substrates are moved so as to perform the deposition process a plurality of times while moving the substrates.

13. The apparatus of claim 1, wherein the mounting surfaces are respectively located at a side of the stage and an opposite side of the stage.

14. The apparatus of claim 1, wherein the mounting surfaces are located at all sides of the stage.

15. A vapor deposition method for forming thin films on a plurality of substrates, the method comprising:
- mounting the plurality of substrates respectively on a plurality of mounting surfaces of a stage in a chamber;
- injecting a source gas into the chamber through an injection unit in a direction parallel with surfaces of the substrates, on which thin films are to be formed;
- performing exhaustion through an exhaust opening of the chamber;
- injecting a reaction gas into the chamber through the injection unit in a direction parallel with the surfaces of the substrates; and
- performing an exhaustion through the exhaust opening of the chamber,
- wherein the thin film deposition is performed while moving the substrates in a direction perpendicular to the surfaces of the substrates, on which the thin film is formed, while being mounted on the stage.

16. The method of claim 15, wherein the exhaustion is performed by a pump.

17. The method of claim 15, wherein the injection unit has an injection opening, and the source gas and the reaction gas are sequentially injected through the injection opening.

18. The method of claim 15, wherein the injection unit has a plurality of injection openings, and the source gas and the reaction gas are respectively injected through different ones of the injection openings.

19. The method of claim 15, wherein the mounting of the substrates comprises placing a mask having an opening for forming the thin films of desired pattern on the substrates.

20. A method of manufacturing an organic light emitting display apparatus comprising a plurality of thin films on a plurality of substrates, the method comprising:
- mounting the plurality of substrates on a plurality of mounting surfaces of a stage in a chamber;
- injecting a source gas into the chamber through an injection unit in a direction parallel with surfaces of the substrate, on which the thin films are to be formed;
- performing exhaustion through an exhaust opening of the chamber;
- injecting a reaction gas into the chamber through the injection unit in a direction parallel with the surfaces of the substrates; and
- performing exhaustion through the exhaust opening of the chamber,
- wherein the thin film deposition is performed while moving the substrates in a direction perpendicular to the surfaces of the substrates, on which the thin film is formed, while being mounted on the stage.

21. The method of claim 20, wherein the forming of the thin films comprises forming an encapsulation layer on a second electrode.

22. The method of claim 20, wherein the forming of the thin films comprises forming an insulating layer.

23. The method of claim 20, wherein the forming of the thin films comprises foaming a conductive layer.

\* \* \* \* \*